United States Patent
Li et al.

(10) Patent No.: US 10,263,092 B2
(45) Date of Patent: Apr. 16, 2019

(54) THIN FILM TRANSISTOR, METHOD FOR MANUFACTURING THE SAME, ARRAY SUBSTRATE AND DISPLAY DEVICE

(71) Applicant: BOE TECHNOLOGY GROUP CO., LTD., Beijing (CN)

(72) Inventors: Haixu Li, Beijing (CN); Zhanfeng Cao, Beijing (CN); Qi Yao, Beijing (CN); Jianguo Wang, Beijing (CN); Dapeng Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/941,195

(22) Filed: Mar. 30, 2018

(65) Prior Publication Data

US 2019/0006482 A1      Jan. 3, 2019

(30) Foreign Application Priority Data

Jun. 30, 2017    (CN) .......................... 2017 1 0527573

(51) Int. Cl.
    *H01L 29/49*      (2006.01)
    *H01L 29/45*      (2006.01)
    (Continued)

(52) U.S. Cl.
    CPC ...... *H01L 29/4966* (2013.01); *H01L 27/1214* (2013.01); *H01L 29/458* (2013.01); *H01L 29/66742* (2013.01); *H01L 29/786* (2013.01)

(58) Field of Classification Search
    CPC ......... H01L 21/02304; H01L 21/76841; H01L 2221/1073; H01L 2224/26; H01L 23/53223; H01L 23/53238; H01L 23/53252; H01L 23/53266; H01L 24/26; H01L 27/1214; H01L 29/458; H01L 29/4966; H01L 29/66742; H01L 29/786
    See application file for complete search history.

(56) References Cited

U.S. PATENT DOCUMENTS 3,617,411 A * 11/1971 Couture ................. C23C 22/00
                                                      438/669
5,296,333 A *  3/1994 Lamarre ................. G03F 7/085
                                                      430/271.1
(Continued)

FOREIGN PATENT DOCUMENTS

JP        57206026 A  * 12/1982     ............... G03F 1/72
KR     20040000803 A  *  1/2004

*Primary Examiner* — Earl N Taylor
(74) *Attorney, Agent, or Firm* — Calfee, Halter & Griswold LLP

(57) ABSTRACT

A thin film transistor, a method for manufacturing the same, an array substrate and a display device are disclosed. The thin film transistor includes a gate having a gate metal layer on a surface of a substrate; a gate insulating layer on the substrate and covering the gate; an active layer on a surface of the gate insulating layer away from the substrate; a source comprising a source metal layer on a surface of the active layer away from the substrate; and a drain having a drain metal layer on a surface of the active layer away from the substrate, wherein the gate, the source or the drain further includes a metal complex layer on a surface of the gate metal layer, the source metal layer or the drain metal layer away from the substrate.

11 Claims, 3 Drawing Sheets

(51) Int. Cl.
 *H01L 29/66* (2006.01)
 *H01L 29/786* (2006.01)
 *H01L 27/12* (2006.01)

(56) References Cited

U.S. PATENT DOCUMENTS

| | | | |
|---|---|---|---|
| 7,846,639 B2* | 12/2010 | Lungu | G03F 7/70608 |
| | | | 430/270.1 |
| 9,390,921 B2* | 7/2016 | Kugler | C23C 18/04 |
| 2005/0048397 A1* | 3/2005 | Jo | C11D 3/0073 |
| | | | 430/256 |
| 2007/0296003 A1* | 12/2007 | Park | H01L 29/42384 |
| | | | 257/288 |
| 2008/0217617 A1* | 9/2008 | Sugawa | H01L 29/4908 |
| | | | 257/59 |
| 2010/0314611 A1* | 12/2010 | Murata | H01L 51/0035 |
| | | | 257/40 |
| 2011/0169033 A1* | 7/2011 | Fukunaga | C07D 249/12 |
| | | | 257/98 |
| 2011/0269309 A1* | 11/2011 | Hong | H01L 21/32139 |
| | | | 438/656 |
| 2012/0012822 A1* | 1/2012 | Kakiuchi | C07F 7/0812 |
| | | | 257/40 |
| 2013/0134453 A1* | 5/2013 | Ushikura | H01L 33/08 |
| | | | 257/88 |
| 2013/0302998 A1* | 11/2013 | Kugler | C23C 18/04 |
| | | | 438/785 |
| 2015/0115258 A1* | 4/2015 | Beak | H01L 27/1225 |
| | | | 257/43 |
| 2017/0028683 A1* | 2/2017 | Ha | B32B 7/12 |
| 2017/0110323 A1* | 4/2017 | An | H01L 21/0272 |
| 2017/0170282 A1* | 6/2017 | Zechmann | H01L 21/76879 |
| 2018/0190681 A1* | 7/2018 | Wang | H01L 27/1244 |
| 2018/0212032 A1* | 7/2018 | Li | H01L 29/458 |
| 2018/0212043 A1* | 7/2018 | Sun | H01L 29/41733 |
| 2018/0267376 A1* | 9/2018 | Wang | G02F 1/136277 |

* cited by examiner

THIN FILM TRANSISTOR, METHOD FOR MANUFACTURING THE SAME, ARRAY SUBSTRATE AND DISPLAY DEVICE

RELATED APPLICATIONS

The present application claims the priority of the Chinese patent application No. 201710527573.3 filed on Jun. 30, 2017, the disclosure of which is incorporated herein by reference.

TECHNICAL FIELD

This disclosure relates to the field of display technologies, and particularly to a thin film transistor, a method for manufacturing the same, an array substrate and a display device.

BACKGROUND

With increasingly higher requirements of display panels, TFT metal wire thinning has become a key point of the requirements since it can solve problems such as aperture ratio and load capacitance. Intensive studies on metal wire thinning are still needed.

SUMMARY

In one aspect of this disclosure, this disclosure provides a thin film transistor. According to embodiments of this disclosure, the thin film transistor comprises: a gate which comprises a gate metal layer on a surface of a substrate; a gate insulating layer which is arranged on the substrate and covers the gate; an active layer which is arranged on a surface of the gate insulating layer away from the substrate; a source which comprises a source metal layer on a surface of the active layer away from the substrate; and a drain which comprises a drain metal layer on a surface of the active layer away from the substrate, wherein the gate, the source and the drain further comprise metal complex layers on surfaces of the gate metal layer, the source metal layer or the drain metal layer away from the substrate.

According to an embodiment of this disclosure, the metal complex layer comprises $M[C_6H_{13}N_2P_2]COOH$, wherein M represents a metal in the gate metal layer, the source metal layer or the drain metal layer.

According to an embodiment of this disclosure, the gate metal layer, the source metal layer and the drain metal layer comprise at least one of copper, silver, aluminum, titanium and molybdenum.

In another aspect of this disclosure, this disclosure provides a method for manufacturing a thin film transistor. According to an embodiment of this disclosure, in the method for manufacturing a thin film transistor, a step of forming a gate, a source or a drain of the thin film transistor comprises: forming a metal layer; forming a metal complex layer on a surface of the metal layer; forming a photoresist pattern on a surface of the metal complex layer away from the metal layer; and removing the metal complex layer and the metal layer which are not covered by the photoresist pattern.

According to an embodiment of this disclosure, forming the metal complex layer comprises: contacting the surface of the metal layer with a complex solution for about 30-90 seconds at about 30-40° C.

According to an embodiment of this disclosure, the complex solution comprises acetic acid, at least one of diazadiphospholane and dioxolane, ammonium ceric nitrate and an impregnating agent.

According to an embodiment of this disclosure, based on a total mass of the complex solution, acetic acid has a concentration of about 3-7% wt, at least one of diazadiphospholane and dioxolane has a concentration of about 5-15% wt, ammonium ceric nitrate has a concentration of about 2-5% wt, and the impregnating agent has a concentration of about 1-3% wt.

According to an embodiment of this disclosure, the metal complex layer comprises $M[C_6H_{13}N_2P_2]COOH$, wherein M represents a metal in the metal layer.

According to an embodiment of this disclosure, the metal layer comprises at least one of copper, silver, aluminum, titanium and molybdenum.

According to an embodiment of this disclosure, the impregnating agent comprises an alcohol impregnating agent and an ester impregnating agent.

According to an embodiment of this disclosure, the photoresist pattern comprises phenolic resin.

In yet another aspect of this disclosure, this disclosure provides an array substrate. According to an embodiment of this disclosure, the array substrate comprises the thin film transistor mentioned above.

In still another aspect of this disclosure, this disclosure provides a display device. According to an embodiment of this disclosure, the display device comprises the array substrate mentioned above.

DETAILED DESCRIPTION OF EMBODIMENTS

The embodiments of this disclosure will be described below in detail. The embodiments described below are exemplary, and they are only used for explaining this disclosure, instead of limiting this disclosure. Embodiments which do not specify specific techniques or conditions are carried out according to the techniques or conditions described in documents of the art or according to a product specification. Agents or instruments without designated producers are all conventional products that are commercially available.

In a current oxide TFT-LCD, the material for forming a source-drain is metal copper which has better electrical conductivity. The adhesiveness between a buffer layer metal of copper and a photoresist (PR) is a problem to be solved. Meanwhile, with increasingly high requirements for the contrast and the resolution of display, line width of the gate and the source-drain should be made very thin. However, thinned metal wires will cause problems of adhesiveness between the metal and the photoresist (PR) during the etching.

During etching of a metal, if the pattern to be obtained has a thin line width, the photoresist may fall off as the binding force between the metal and the photoresist becomes weaker, which constrains the process of thinning metal wires. Meanwhile, during a half tone mask (HTM) process, an adhesive section between the metal and the photoresist will be reduced during a second etching, so the falling-off of the photoresist will deteriorate during the second etching in a conventional HTM process.

This disclosure aims to at least solve to some degree one of the technical problems in the relevant art. To this end, it is an objective of this disclosure to propose a thin film transistor capable of thinning metal electrodes.

After research, the inventor has found that there may be two interactive forces on the interface where the metal connects the photoresist: one is a molecular force which mainly relates to connection of the organic adhesive with the metal; the other is a hydrogen bond which is mainly the interaction force of polar small molecules (e.g., N, O, etc.) with H atoms. The hydrogen bond is a force between an inter-molecular force and a chemical bond. Therefore, if the hydrogen bonding is enhanced, the adhesiveness between the metal and the photoresist will be increased. The photoresist is generally phenolic resin which contains a large quantity of H and O atoms, so after profound research, the inventor proposes forming a metal complex layer with a large number of hydrogen bond donors H and acceptors O and N between the metal and the photoresist, to form hydrogen bonds between the photoresist and the metal complex layer such that the metal and the photoresist are closely bonded together. Even if the line width of the metal is thinned during the etching and the contact area between the metal and the photoresist is reduced, they will not easily fall off from each other, and thereby a thinned metal is obtained.

Figure 1:
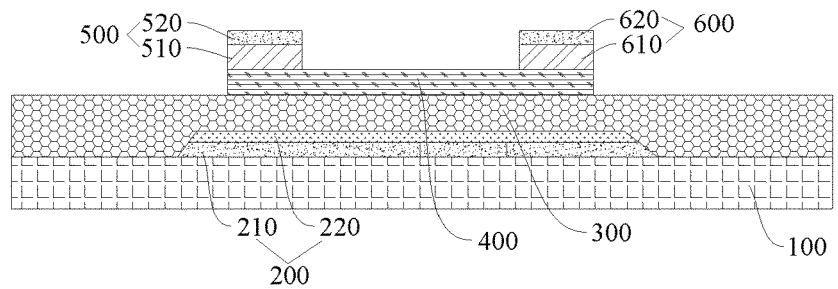
FIG. 1 is a schematic structure view of a thin film transistor in an embodiment of this disclosure.

In one aspect of this disclosure, this disclosure provides a thin film transistor. According to an embodiment of this disclosure, referring to FIG. 1, the thin film transistor comprises: a substrate 100, a gate 200 comprising a gate metal layer 210 and a gate metal complex layer 220, the gate metal layer 210 being arranged on a surface of the substrate 100, and the gate metal complex layer 220 being arranged on a surface of the gate metal layer 210 away from the substrate 100; a gate insulating layer 300 arranged on a surface of the substrate 100 and covering the gate 200; an active layer 400 on a surface of the gate insulating layer 300 away from the substrate 100; a source 500 comprising a source metal layer 510 and a source metal complex layer 520, the source metal layer 510 being arranged on a surface of the gate insulating layer 300 and the active layer 400 away from the substrate 100, the source metal complex layer 520 being arranged on a surface of the source metal layer 510 away from the substrate 100; and a drain 600 comprising a drain metal layer 610 and a drain metal complex layer 620, the drain metal layer 610 being arranged on a surface of the gate insulating layer 300 and the active layer 400 away from the substrate 100, and the drain metal complex layer 620 being arranged on a surface of the drain metal layer 610 away from the substrate 100.

It is found that by arranging in the gate, the source and the drain, metal complex layers containing a great number of O and N atoms that can serve as hydrogen bond acceptors and meanwhile a great number of H atoms that can serve as hydrogen bond donors, (the photoresist is generally phenolic resin which contains a large quantity of H and O atoms), H and N or O form hydrogen bonds, which enhance the adhesiveness between the metal and the photoresist, and thus the metal layers in the gate, the source and the drain will not fall off from the photoresist despite the fact that the line width is thinned and the adhesive section with the photoresist is reduced during the etching, and thereby the gate, the source and the drain can be fabricated with a thinned width (which can be smaller than 2 μm), which facilitates the reduction in the volume of the thin film transistor and improves the aperture ratio, the contrast and the resolution of a display device containing the thin film transistor.

According to an embodiment of this disclosure, there are no special limitations for the specific type of the substrate, which can be selected flexibly by those skilled in the art upon actual situations. In some embodiments of this disclosure, the substrate can be specifically be a glass substrate, a ceramic substrate or a polymer substrate, which boasts of wide range of sources, low cost and good performance.

According to an embodiment of this disclosure, there are no special requirements for materials forming the gate metal layer, the source metal layer and the drain metal layer as long as they have good electrical conductivity. In some embodiments of this disclosure, the materials forming the gate metal layer, the source metal layer and the drain metal layer each independently comprise at least one of copper, silver, aluminum, titanium and molybdenum. Therefore, the range of material sources is wide, and the electrical conductivity is good, and the use performance is excellent. Moreover, the above metals can satisfy the use requirements of different parts in different conditions and can be applied widely.

According to an embodiment of this disclosure, there are no special limitations for the method for forming the gate metal layer, the source metal layer and the drain metal layer, which can be selected flexibly by those skilled in the art upon actual situations. In some embodiments of this disclosure, the method for forming the gate metal layer, the source metal layer and the drain metal layer comprises but is not limited to coating, deposition, printing and so on, which is simple and convenient in operation, and easy to control.

According to an embodiment of this disclosure, in order to obtain a gate metal complex layer, a source metal complex layer and a drain metal complex layer having stronger hydrogen bonding, the step of forming a gate metal complex layer, a source metal complex layer and a drain metal complex layer comprises: contacting surfaces of the gate metal layer, the source metal layer and the drain metal layer away from the substrate with a complex solution for about 30-90 seconds at about 30-40° C. Specifically, there are no special limitations for the specific way in which the surfaces of the gate metal layer, the source metal layer and the drain metal layer away from the substrate are contacted with the complex solution as long as coordination reaction can happen between the complex solution and the gate metal layer, the source metal layer and the drain metal layer, so those skilled in the art can make flexible selections upon needs, for example, comprising but not limited to spraying the complex solution to the surfaces of the gate metal layer, the source metal layer and the drain metal layer, or immersing the surfaces of the gate metal layer, the source metal layer and the drain metal layer into the complex solution, or contacting the gate metal layer, the source metal layer and the drain metal layer with the complex solution in a manner combining spraying and immersing. In this way, metal complex layers having stronger hydrogen bonding can be formed rapidly and effectively on surfaces of the gate metal layer, the source metal layer and the drain metal layer so as to provide convenient conditions for the subsequent photolithography process, thin the metal electrodes and meanwhile improve the operation efficiency and the product yield.

According to an embodiment of this disclosure, in order to increase the hydrogen bond acceptors and donors in the gate metal complex layer, the source metal complex layer and the drain metal complex layer, the complex solution comprises acetic acid, at least one of diazadiphospholane and dioxolane, ammonium ceric nitrate and an impregnating agent. By doing this, the $M[C_6H_{13}N_2P_2]COOH$ metal complex layer formed on the surfaces of the gate metal layer, the source metal layer and the drain metal layer contains a large number of hydrogen bond acceptors and donors, which form hydrogen bonds with H and O atoms in the photoresist in the subsequent steps, and thereby the adhesiveness between the photoresist and the gate metal layer, the source metal layer and the drain metal layer is increased and the metal electrodes are thinned.

According to an embodiment of this disclosure, in order to achieve an optimal bonding effect between the photoresist and the gate metal layer, the source metal layer and the drain metal layer, a complex solution is obtained by dissolving in water an appropriate amount of acetic acid, at least one of diazadiphospholane and dioxolane, ammonium ceric nitrate and an impregnating agent. Based on a total mass of the complex solution, the content of each component in the complex solution is: about 3-7% wt of acetic acid, about 5-15% wt of at least one of diazadiphospholane and dioxolane, about 2-5% wt of ammonium ceric nitrate, and about 1-3% wt of the impregnating agent. Thereby, the adhesiveness between the photoresist and the gate metal layer, the source metal layer and the drain metal layer is optimal.

It should be noted that there are no special limitations for the specific type of the impregnating agent as long as it can reduce the surface tension of the metal layer, enhance the impregnating effect of the complex solution and meanwhile function to strengthen the bonding force. It can be any known impregnating agent of the art, for example, including but not limited to an alcohol impregnating agent, an ester impregnating agent and so on.

Figure 2:
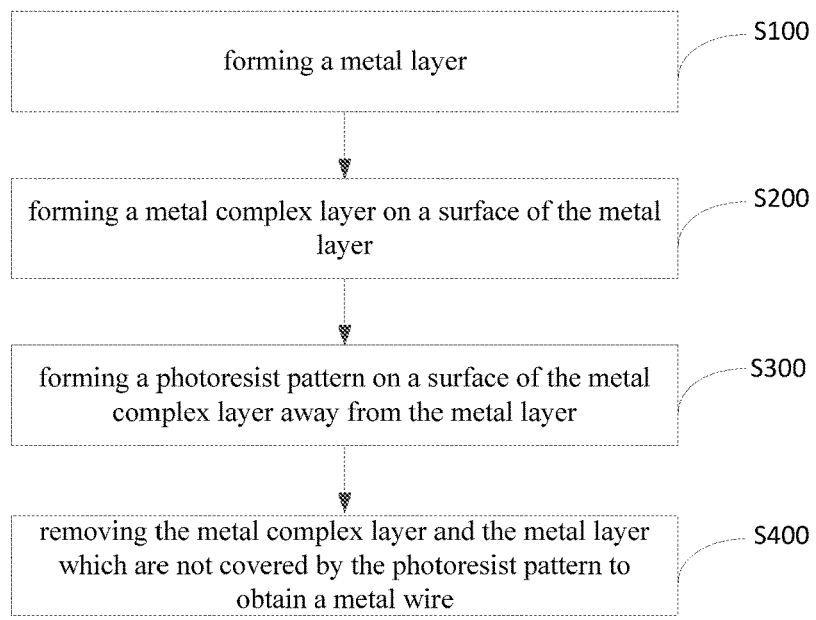
FIG. 2 is a flow chart of a method for manufacturing a thin film transistor in an embodiment of this disclosure.
Figure 3:
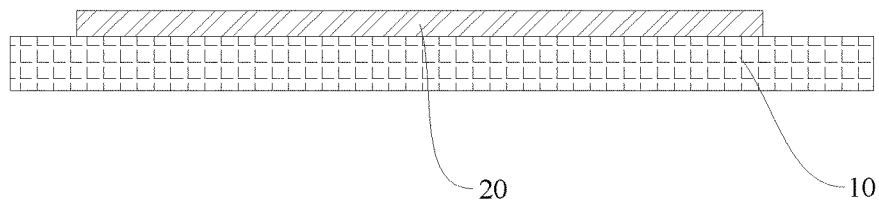
FIGS. 3, 4, 5, 6 and 7 are diagrams for illustrating a method for manufacturing a thin film transistor in another embodiment of this disclosure.

In another aspect of this disclosure, this disclosure provides a method for manufacturing a thin film transistor. According to an embodiment of this disclosure, referring to FIG. 2, in the method for manufacturing a thin film transistor, the step of forming the gate, the source or the drain of the thin film transistor comprises:

S100: forming a metal layer 20. See FIG. 3 for the schematic structure view.

According to an embodiment of this disclosure, the metal layer 20 can be formed on a base 10 having a support function. There are no special limitations for the specific type of the base, and it can be a substrate in a display device, e.g., a glass substrate, a ceramic substrate, a polymer substrate and so on, and it can also be a semifinished product with some layered structures formed on a substrate, e.g., the gate can be directly formed on a substrate, while the source and the drain need to be formed on a substrate on which the gate, the gate insulating layer and the active layer are formed.

According to an embodiment of this disclosure, there are no special requirements for materials for forming the metal layer as long as they have good electrical conductivity. In some embodiments of this disclosure, the materials for forming the metal layer comprise at least one of copper, silver, aluminum, titanium and molybdenum. Therefore, the range of material sources is wide, and the electrical conductivity is good, and the use performance is excellent. Moreover, the above metals can satisfy the use requirements of different parts in different conditions and can be applied widely.

According to an embodiment of this disclosure, there are no special limitations for the method for forming the metal layer, which can be selected flexibly by those skilled in the art upon actual situations. In some embodiments of this disclosure, the method for forming the metal layer comprises but is not limited to coating, deposition, printing and so on, which is simple and convenient in operation, and easy to control. Therefore, the fabrication process is simple, convenient and mature with a low cost and can be easily applied in industrial production. Moreover, the metal wires obtained thereby have a narrow line width, so a display device containing the thin film transistor has a higher aperture ratio and a better display effect.

Figure 4:
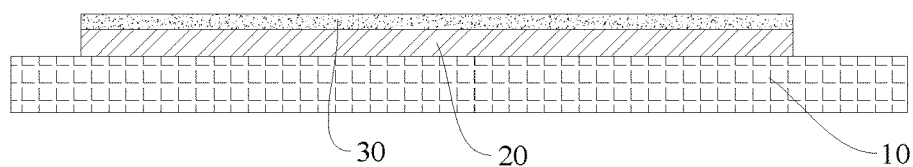

S200: forming a metal complex layer 30 on a surface of the metal layer 20. See FIG. 4 for the schematic structure view.

According to an embodiment of this disclosure, in order to obtain a metal complex layer having stronger hydrogen bonding, the step of forming a metal complex layer comprises: contacting a surface of the metal layer away from the substrate with a complex solution for about 30-90 seconds at about 30-40° C. Specifically, there are no special limitations for the specific way in which the surface of the metal layer away from the substrate is contacted with the complex solution as long as coordination reaction can happen between the complex solution and the metal layer, so those skilled in the art can make flexible selections upon needs, for example, comprising but not limited to spraying the complex solution to the surface of the metal layer, or immersing the surface of the metal layer into the complex solution. In this way, a metal complex layer having stronger hydrogen bonding can be formed rapidly and effectively on the surface of the metal layer so as to provide convenient conditions for the subsequent photolithography process, and improve the operation efficiency and the product yield.

According to an embodiment of this disclosure, in order to increase the hydrogen bond acceptors and donors in the metal complex layer, the complex solution comprises acetic acid, at least one of diazadiphospholane and dioxolane, ammonium ceric nitrate and an impregnating agent. By doing this, the $M[C_6H_{13}N_2P_2]COOH$ metal complex layer formed on the surface of the metal layer contains a large number of hydrogen bond acceptors and donors, which form hydrogen bonds with H and O atoms in the photoresist in the subsequent steps, and thereby the adhesiveness between the photoresist and the metal layer is increased.

According to an embodiment of this disclosure, in order to achieve an optimal bonding effect between the photoresist and the metal layer, a complex solution is obtained by dissolving in water an appropriate amount of acetic acid, at least one of diazadiphospholane and dioxolane, ammonium ceric nitrate and an impregnating agent. Based on a total mass of the complex solution, the content of each component in the complex solution is: about 3-7% wt of acetic acid, about 5-15% wt of at least one of diazadiphospholane and dioxolane, about 2-5% wt of ammonium ceric nitrate, and about 1-3% wt of the impregnating agent. Thereby, the adhesiveness between the photoresist and the metal layer is optimal.

It should be noted that there are no special limitations for the specific type of the impregnating agent as long as it can reduce the surface tension of the metal layer, enhance the impregnating effect of the complex solution and meanwhile function to strengthen the bonding force. It can be any known impregnating agent of the art, for example, including but not limited to an alcohol impregnating agent, an ester impregnating agent and so on.

Figure 5:
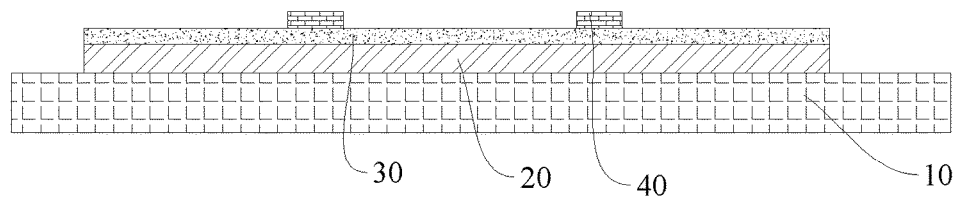

S300, forming a photoresist pattern 40 on a surface of the metal complex layer 30 away from the metal layer 20. See FIG. 5 for the schematic structure view.

According to an embodiment of this disclosure, there are no limitations and requirements for the method and materials for forming the photoresist pattern, which can be selected flexibly by those skilled in the art upon actual situations. For example, a photoresist layer can be applied first onto the entire surface of the metal layer by coating, and then exposed and developed to form a photoresist pattern 30.

Figure 6:
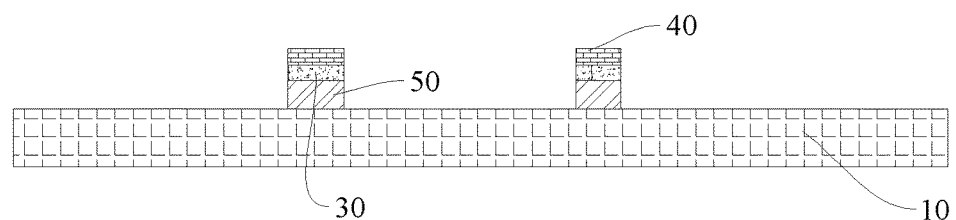

S400: removing the metal complex layer and the metal layer which are not covered by the photoresist pattern to obtain a metal wire 50, wherein the metal wire can be a gate, a source or a drain of the thin film transistor. See FIG. 6 for the schematic structure view.

According to an embodiment of this disclosure, there are no limitations and requirements for the method for removing the metal complex layer and the metal layer which are not covered by the photoresist pattern, which can be selected flexibly by those skilled in the art upon actual situations. In some embodiments of this disclosure, the metal complex layer and the metal layer can be removed by an etching process, including but not limited to wet etching and dry etching, which is simple in operation, mature in process and easy to achieve with a low cost.

Figure 7:
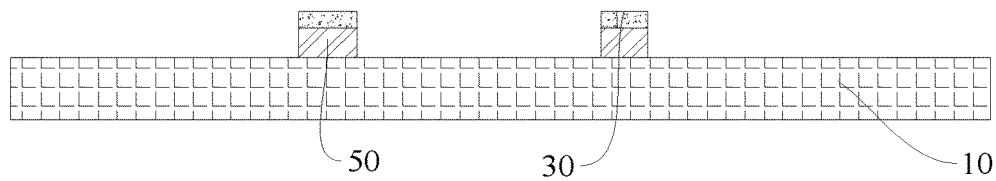

According to an embodiment of this disclosure, the photoresist pattern or part of the photoresist pattern can be further removed upon actual needs in subsequent steps according to different processes. See FIG. 7 for the schematic structure view of a resulting structure with the photoresist pattern all removed. If a half tome mask is used, it will be necessary to remove part of the photoresist pattern, which can be carried out by those skilled in the art in accordance with conventional operations and will not be repeated herein for simplicity.

By doing this, hydrogen bonds are formed between the metal layer and the photoresist, which enhance the adhesiveness between the metal and the photoresist, and thus the metal layer will not fall off from the photoresist despite the fact that the line width is thinned and the adhesive section with the photoresist is reduced during the etching, and thereby metal wires can be fabricated with a thinned width, and moreover, the fabrication is simple, convenient and mature with a low cost and can be easily applied in industrial production.

Those skilled in the art can understand that, apart from the step of forming a gate, a source and a drain as mentioned above, the method for manufacturing a thin film transistor should further comprise processes and steps for forming other necessary structural components, e.g., processes and steps for forming a gate insulating layer, an active layer and a passivation layer, which can be carried out by those skilled in the art in accordance with conventional operations and will not be repeated herein for simplicity.

Figure 8:
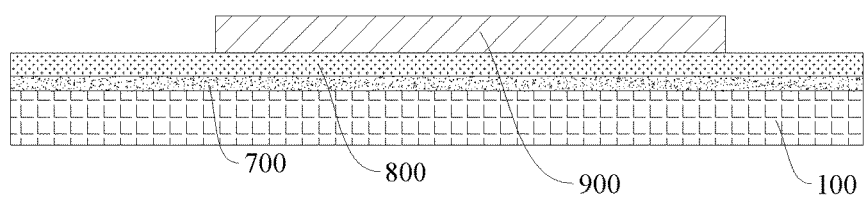
FIGS. 8, 9, 10, 11 and 12 are diagrams for illustrating a method for manufacturing a thin film transistor in yet another embodiment of this disclosure.

Detailed explanations will be given below according to a specific embodiment for manufacturing a thin film transistor in this disclosure, wherein the gate, the source and the drain are formed by using the method for fabricating a metal wire as mentioned above. Specifically, referring to FIG. 8, forming a metal layer 700 on a side of a substrate 100, and then forming a first metal complex layer 800 on a surface of the first metal layer away from the substrate 100, and then forming a photoresist pattern 900 on a surface of the first metal complex layer 800 away from the substrate 100.

Figure 9:
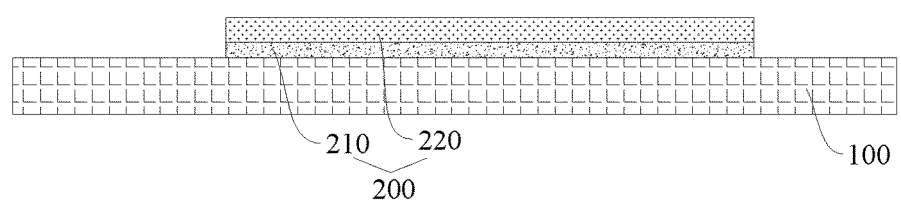
Figure 10:
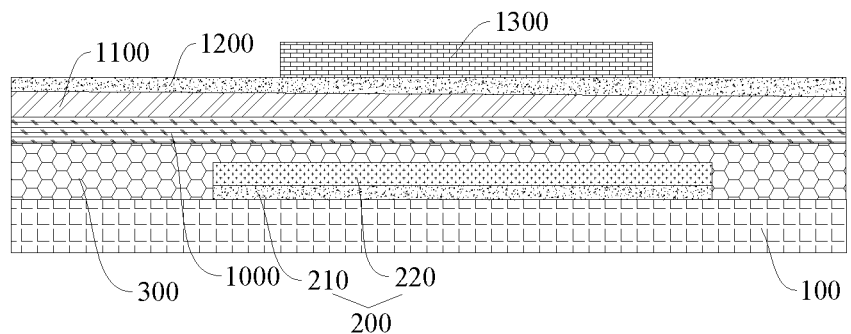
Figure 11:
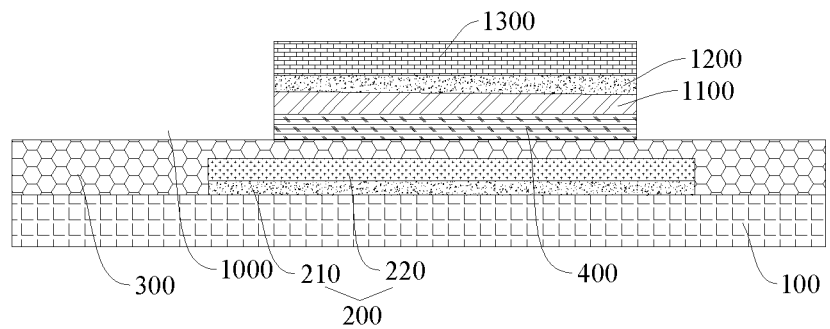
Figure 12:
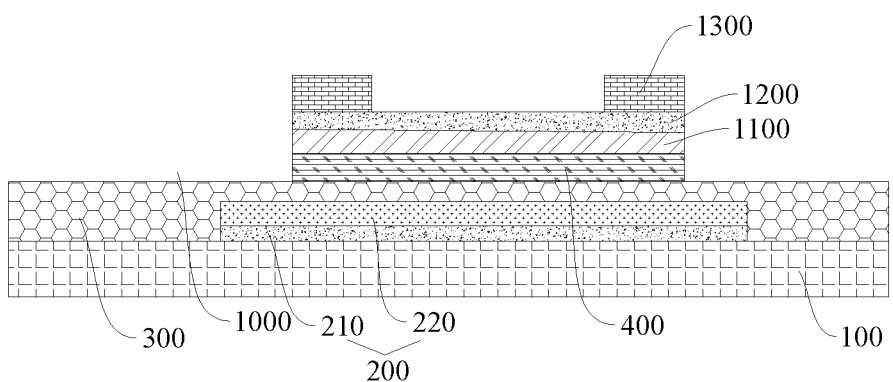

Referring to FIG. 9, etching away the first metal layer 700 and the first metal complex layer 800 which are not covered by the photoresist pattern 900, and removing the photoresist pattern 900 to form a gate metal layer 210 and a gate metal complex layer 220. The gate metal layer 210 and the gate metal complex layer 220 conjunctively form a gate 200. Referring to FIG. 10, forming a gate insulating layer 300 covering the gate 200 on the substrate 100, forming a semiconductor layer 1000 on a side of the gate insulating layer 300 away from the substrate 100, forming a second metal layer 1100 on a side of the semiconductor layer 1000 away from the substrate 100, forming a second metal complex layer 1200 on a side of the second metal layer 1100 away from the substrate 100, and forming a photoresist 1300 on a side of the second metal complex layer 1200 away from the substrate 100. Referring to FIG. 11, removing by a metal etching process the semiconductor layer 1000, the second metal layer 1100 and the second metal complex layer 1200 which are not covered by the photoresist 1300 to form an active layer 400. Referring to FIG. 12, removing the photoresist in the middle, and removing by a metal etching process the second metal layer 1100 and the second metal complex layer 1200 which are not covered by the photoresist, and removing the photoresist 1300 to form a source and a drain (e.g., referring to the source 500 and the drain 600 in FIG. 1).

Those skilled in the art can understand that, the method for forming a metal complex layer is consistent with the one mentioned above, and other steps can be all carried out in accordance with conventional operations of the art and will not be repeated herein for simplicity.

According to an embodiment of this disclosure, there are no special requirements for the process for removing the photoresist pattern, which can be selected flexibly by those skilled in the art upon actual situations. In some embodiments of this disclosure, the process for removing the photoresist is an ashing process, which is mature in process and can be easily applied in industrial application.

According to an embodiment of this disclosure, there are no limitations and requirements for the method and materials for forming the gate insulating layer, which can be selected flexibly by those skilled in the art upon actual situations. In some embodiments of this disclosure, the method for forming a gate insulating layer can be coating, deposition, printing and so on, and the materials for forming a gate insulating layer can be silicon nitride, silicon carbide or silicon dioxide, etc.

According to an embodiment of this disclosure, there are no special limitations and requirements for the method for forming the active layer, which can be selected flexibly by those skilled in the art upon actual situations. In some embodiments of this disclosure, the method for forming the active layer can be coating, deposition, printing and so on.

According to an embodiment of this disclosure, there are no special limitations and requirements for the materials for forming the active layer, which can be selected flexibly by those skilled in the art upon actual situations. In some embodiments of this disclosure, the active layer can be made of low-temperature polysilicon or indium gallium zinc oxide, etc.

In yet another aspect of this disclosure, this disclosure provides an array substrate. According to an embodiment of this disclosure, the array substrate comprises the thin film transistor mentioned above. Therefore, the aperture ratio is high, and the electrical stability is good and the use performance is excellent.

Those skilled in the art can understand that, apart from the thin film transistor mentioned above, the array substrate of this disclosure further comprises other structural components necessary for a conventional array substrate, e.g., a common electrode, a pixel electrode, a functional layer and so on.

In still another aspect of this disclosure, this disclosure provides a display device. According to an embodiment of this disclosure, the display device comprises the array substrate mentioned above. Therefore, the aperture ratio is high, and the electrical stability is good and the use performance is excellent.

According to an embodiment of this disclosure, there are no special limitations for the specific type of the display device, and it can be device or apparatus having a display function, for example, including but not limited to a cellphone, a tablet computer, a computer display, a game machine, a television, a display screen, a wearable device and other domestic appliance or home appliance having a display function.

Obviously, those skilled in the art can understand that, apart from the array substrate mentioned above, the display device of this disclosure can further comprise structures and components necessary for a conventional display device. To take a cellphone as an example, apart from the array substrate of this disclosure, it can further comprise structures and components necessary for a conventional cellphone such as a touch screen, a housing, a CPU, a camera module, a fingerprint identification module and a sound processing system, which will not be repeated herein for simplicity.

Although the embodiments of this disclosure have been shown and described, it can be understood that the embodiments are exemplary, and they cannot be construed as limiting this disclosure, and one having ordinary skills in the art can vary, alter, substitute and modify the above embodiments within the scope of this disclosure.

What is claimed is:

1. A thin film transistor, comprising:
    a gate which comprises a gate metal layer on a surface of a substrate;
    a gate insulating layer which is arranged on the substrate and covers the gate;
    an active layer which is arranged on a surface of the gate insulating layer away from the substrate;
    a source which comprises a source metal layer on a surface of the active layer away from the substrate; and
    a drain which comprises a drain metal layer on a surface of the active layer away from the substrate,
    wherein the gate, the source or the drain further comprises a metal complex layer on a surface of the gate metal layer, the source metal layer or the drain metal layer away from the substrate, the metal complex layer comprising $M[C_6H_{13}N_2P_2]COOH$, wherein M represents a metal in the gate metal layer, the source metal layer or the drain metal layer.

2. The thin film transistor according to claim 1, wherein the gate metal layer, the source metal layer and the drain metal layer comprise at least one of copper, silver, aluminum, titanium and molybdenum.

3. An array substrate comprising the thin film transistor according to claim 1.

4. A display device comprising the array substrate according to claim 3.

5. A method for manufacturing a thin film transistor, wherein a step of forming a gate, a source or a drain of the thin film transistor comprises:
    forming a metal layer;
    forming a metal complex layer on a surface of the metal layer, the metal complex layer comprising $M[C_6H_{13}N_2P_2]COOH$, wherein M represents a metal in the metal layer;
    forming a photoresist pattern on a surface of the metal complex layer away from the metal layer; and
    removing the metal complex layer and the metal layer which are not covered by the photoresist pattern.

6. The method according to claim 5, wherein forming the metal complex layer comprises:
    contacting the surface of the metal layer with a complex solution for about 30-90 seconds at about 30-40° C.

7. The method according to claim 6, wherein the complex solution comprises acetic acid, at least one of diazadiphospholane and dioxolane, ammonium ceric nitrate and an impregnating agent.

8. The method according to claim 7, wherein based on a total mass of the complex solution, acetic acid has a concentration of about 3-7% wt, at least one of diazadiphospholane and dioxolane has a concentration of about 5-15% wt, ammonium ceric nitrate has a concentration of about 2-5% wt, and the impregnating agent has a concentration of about 1-3% wt.

9. The method according to claim 5, wherein the metal layer comprises at least one of copper, silver, aluminum, titanium and molybdenum.

10. The method according to claim 7, wherein the impregnating agent comprises an alcohol impregnating agent and an ester impregnating agent.

11. The method according to claim 5, wherein the photoresist pattern comprises phenolic resin.

* * * * *